(12) United States Patent
Burghartz et al.

(10) Patent No.: US 8,508,038 B2
(45) Date of Patent: Aug. 13, 2013

(54) METHOD FOR PRODUCING AN INTEGRATED CIRCUIT AND RESULTING FILM CHIP

(75) Inventors: Joachim N. Burghartz, Leinfelden-Echterdingen (DE); Christine Harendt, Muehlacker (DE)

(73) Assignee: Institut fuer Mikroelektronik Stuttgart, Stuttgart (DE)

( * ) Notice: Subject to any disclaimer, the term of this patent is extended or adjusted under 35 U.S.C. 154(b) by 0 days.

(21) Appl. No.: 13/344,089

(22) Filed: Jan. 5, 2012

(65) Prior Publication Data

US 2012/0161293 A1 Jun. 28, 2012

Related U.S. Application Data

(63) Continuation of application No. PCT/EP2010/059647, filed on Jul. 6, 2010.

(30) Foreign Application Priority Data

Jul. 6, 2009 (DE) .......................... 10 2009 032 219

(51) Int. Cl.
*H01L 23/13* (2006.01)
(52) U.S. Cl.
USPC .................... 257/702; 257/E23.004; 438/126
(58) Field of Classification Search
USPC .................. 257/701, 702, E23.003, E23.004, 257/E23.125; 438/126, 127
See application file for complete search history.

(56) References Cited

U.S. PATENT DOCUMENTS

| 5,111,278 | A | * | 5/1992 | Eichelberger | ................. 257/698 |
| 5,353,195 | A | * | 10/1994 | Fillion et al. | ................. 361/760 |
| 5,465,217 | A | * | 11/1995 | Yip et al. | ...................... 716/115 |
| 2004/0195686 | A1 | * | 10/2004 | Jobetto et al. | ................. 257/734 |
| 2007/0117274 | A1 | | 5/2007 | Swindlehurst et al. | |
| 2007/0249068 | A1 | | 10/2007 | Siebert | |
| 2008/0036093 | A1 | | 2/2008 | Tuominen | |
| 2009/0098708 | A1 | | 4/2009 | Burghartz et al. | |

FOREIGN PATENT DOCUMENTS

| DE | 42 28 274 A1 | 3/1994 |
| DE | 103 34 577 B3 | 2/2005 |
| DE | 10 2006 001 429 | 3/2007 |
| DE | 10 2008 022 733 | 11/2009 |
| EP | 0 452 506 B1 | 3/1996 |
| WO | 2007/104443 A1 | 9/2007 |

OTHER PUBLICATIONS

ISP/EP; English language translation of International Preliminary Report on Patentability (Chapter 1); issued by WIPO Jan. 10, 2012; 11 pages.

* cited by examiner

*Primary Examiner* — Julio J Maldonado
*Assistant Examiner* — Daniel Shook
(74) *Attorney, Agent, or Firm* — Harness, Dickey & Pierce, P.L.C.

(57) ABSTRACT

A semiconductor substrate having a first lateral dimension is combined with a flexible film piece having a second lateral dimension by arranging the semiconductor substrate in a recess of the film piece. The semiconductor substrate has circuit structures produced using lithography process steps. After the semiconductor substrate has been arranged in the recess of the film piece, a patterned layer of an electrically conductive material is produced above the semiconductor substrate and the film piece using lithography process steps. The patterned layer extends from the semiconductor substrate up to the flexible film piece and forms a number of electrically conductive contact tracks between the semiconductor substrate and the film piece.

7 Claims, 3 Drawing Sheets

METHOD FOR PRODUCING AN INTEGRATED CIRCUIT AND RESULTING FILM CHIP

CROSS REFERENCES TO RELATED APPLICATIONS

This application is a continuation of international patent application PCT/EP2010/059647 filed on Jul. 6, 2010 designating the U.S., which international patent application has been published in German language and claims priority from German patent application DE 10 2009 032 219.1 filed on Jul. 6, 2009. The entire contents of these priority applications are incorporated herein by reference.

BACKGROUND OF THE INVENTION

The present invention relates to a method for producing a film chip having an integrated circuit, i.e. a circuit comprising a number of electronic components integrated into a common semiconductor body.

It has long been known to produce integrated circuits on the basis of substantially rigid semiconductor materials which predominantly originate from group IV of the periodic system or are combined materials from groups II and V of the periodic system. Known materials are, in particular, silicon, germanium, gallium arsenide and others. Using modern lithography process steps, it is possible to produce extremely fine structures in and on rigid semiconductor substrates from such materials. The lithography process steps typically comprise producing mask structures on the semiconductor substrate using exposure and etching steps and depositing and/or introducing impurity materials onto or into the semiconductor substrate. However, the lithography process technology is very complex and expensive with the result that the production of integrated circuits pays for itself only in the case of very large numbers and high integration densities. Nevertheless, the production of integrated circuits in rigid semiconductor materials using lithography process steps has become widely prevalent.

For some time, endeavors have also been made to use so-called organic semiconductor materials for producing electronic circuits. The electronic components are produced here predominantly, but not exclusively, from organic materials and/or on films composed of organic material, in particular polymer films. In general, the circuit structures are produced on such films using relatively cost-effective printing methods, which promises economic advantages over conventional semiconductor technology, particularly if the end product is intended to have a large area as in the case of graphical displays. The printing techniques generally lead to coarser structures in comparison with the very fine structures that can be produced with the "classic" lithography techniques on silicon and other rigid semiconductor materials. The two technologies, i.e. integrated semiconductor technology on the basis of silicon and other rigid semiconductor materials and organic electronics using printing techniques, are in a way complementary with regard to the costs of a circuit per area, the degree of integration and the performance of the circuit.

Therefore, it is desirable to combine the advantages of both technologies in a hybrid approach. This necessitates connecting an integrated circuit arranged on or in a rigid semiconductor substrate to an organic carrier material, which is generally flexible. Difficulties are posed here primarily by the electrical contact-connection of the filigree structures on the rigid semiconductor substrate, since the structures on the organic carrier material cannot be realized as finely using known printing techniques. On the other hand, conventional lithography processes presuppose rigid materials.

EP 0 452 506 B1 discloses a method for producing a flexible film piece, on which an integrated semiconductor circuit is arranged. In one exemplary embodiment, the flexible film piece is a polymer film. The film is provided on one side with an electrically conductive structure having pin-like projections in the region of the mounting location for the integrated semiconductor circuit. The projections pass through the film and protrude beyond the film on the second side of the film. They make contact there with so-called bonding pads, i.e. specific contact areas embodied in the edge region of the integrated semiconductor circuit. The semiconductor circuit is placed by the bonding pads onto the free ends of the pin-like projections and soldered. EP 0 452 506 B1 thus discloses a method for mechanically fixing and electrically contact-connecting a substantially rigid semiconductor chip on a flexible film piece. However, the known method requires relatively large contact areas on the semiconductor chip, i.e. contact areas which are significantly larger than the circuit structures of the individual components in the chip. Valuable chip area for the production of the integrated circuit structures is thus lost. The smaller the contact areas are made, the higher the complexity when positioning the semiconductor chip on the pin-like projections. These disadvantages have a particularly great effect if the semiconductor chip comprising the integrated circuit is e.g. a control or driver circuit for a large-area display that is intended to be realized using organic electronics on the flexible film piece. Such a control or driver circuit requires a very large number of contact areas, such that a relatively large chip area is required for contact-connection.

DE 42 28 274 A1 discloses a method for making contact with an optoelectronic component composed of a substantially rigid semiconductor material. In one exemplary embodiment, the component is a light emitting diode composed of gallium arsenide. The component is fixed, e.g. soldered or adhesively bonded, on a carrier body. Instead of known bonding wires, DE 42 28 274 A1 proposes arranging a polyimide film above the carrier body and the component, contact holes being introduced into said polyimide film. Afterward, a metal layer is deposited on the polyimide film, wherein the metal also penetrates into the contact holes and in this way electrically connects the component and the carrier body.

SUMMARY OF THE INVENTION

Against this background, it is an object of the present invention to provide a method for combining conventional semiconductor chips produced from silicon and/or other substantially rigid semiconductor materials with a flexible film piece, in particular composed of an organic semiconductor material, simply and cost-effectively.

According to one aspect of the invention, there is provided a method for producing an integrated circuit, comprising the steps of providing a semiconductor substrate having a first lateral dimension and having a first substrate surface and a second substrate surface arranged substantially parallel to the first substrate surface; producing circuit structures in the semiconductor substrate using lithography process steps; providing a first flexible film piece having a second lateral dimension which is greater than the first lateral dimension, and having a recess in the lateral dimension, said first flexible film piece further having a first film piece surface and a second film piece surface which is arranged substantially parallel to the first film piece surface; arranging the semiconductor substrate and the first flexible film piece on a holding body, with said semiconductor substrate being positioned in the recess; encapsulating the second substrate surface and the second film piece surface with a potting material in order to form a combined film chip; detaching the film chip from the holding body; and producing a patterned layer of an electrically conductive material above the semiconductor substrate and the first flexible film piece using lithography process steps; wherein the patterned layer extends from the semiconductor substrate to the first flexible film piece and forms a number of electrically conductive contact tracks between the semiconductor substrate and the first film piece; wherein the first substrate surface and the first film piece surface are arranged on the holding body in a plane-parallel fashion in order to orient the first substrate surface and the first film piece surface in plane-parallel fashion; wherein the combined film chip is detached from the holding body such that the plane-parallel first substrate surface and first film piece surface are directly accessible; and wherein the patterned layer is produced directly on the semiconductor substrate and the first flexible film piece such that the semiconductor substrate and the film piece are electrically connected without contact holes.

According to another aspect, there is provided film chip comprising an integrated electronic circuit, comprising a semiconductor substrate having a first lateral dimension, in which circuit structures have been produced using lithography process steps, comprising a flexible film piece having a second lateral dimension which is greater than the first lateral dimension, and having a recess in the second lateral dimension, wherein the semiconductor substrate is arranged in the recess, and comprising a patterned layer composed of an electrically conductive material above the semiconductor substrate and the film piece, which layer extends from the semiconductor substrate to the film piece and forms a number of electrically conductive contact tracks between the semiconductor substrate and the film piece, wherein the patterned layer is produced using lithography process steps, and wherein the patterned layer is produced directly on the semiconductor substrate and the first flexible film piece such that the semiconductor substrate and the film piece are electrically connected without contact holes.

According to yet another aspect, there is also provided a method for producing an integrated circuit, comprising the steps of providing a semiconductor substrate having a first lateral dimension; producing circuit structures in the semiconductor substrate using lithography process steps; providing a first flexible film piece having a second lateral dimension, which is greater than the first lateral dimension, and having a recess in the lateral dimension; arranging the semiconductor substrate in the recess; and producing a patterned layer of an electrically conductive material above the semiconductor substrate and the first flexible film piece using lithography process steps, wherein the patterned layer extends from the semiconductor substrate up to the first flexible film piece and forms a number of electrically conductive contact tracks between the semiconductor substrate and the first film piece.

A patterned layer that is produced using lithography process steps is manifested in the novel film chip primarily by virtue of the fact that the structures of the layer are so filigree that they can only be produced by means of lithography process steps. In other words, the lateral dimensions of the individual structure elements, for instance of a conductor track or of a contact area, are smaller and more filigree than is possible by using thick-film process steps including known printing techniques. The novel method uses the known lithography process steps not only for producing the circuit structures in the usually rather rigid semiconductor substrate, but also for producing the electrical contact tracks that lead from the rather rigid semiconductor substrate to the rather flexible carrier material in comparison therewith. Therefore, the novel film chip produced using the novel method has a common, continuous contact-connecting layer over the semiconductor substrate and the flexible film piece. On account of the lithography process steps, said contact-connecting layer can be patterned significantly more finely than is possible by means of known printing techniques. Consequently, it is possible to dispense with comparatively large contact areas on the semiconductor substrate. The production of electrically conductive connections between the integrated circuit structures in the semiconductor substrate and the flexible film piece is possible in a highly space-saving manner with the novel method.

Furthermore, the novel method and the film chip based thereon have the advantage that the electrically conductive contact tracks between the semiconductor substrate and the flexible film piece are produced only after the semiconductor substrate and the film piece have already been arranged relative to one another. Consequently, the method is rather insensitive toward tolerances when positioning the semiconductor substrate relative to the film piece. The electrically conductive contact tracks connect the semiconductor substrate and the film piece just as they are actually positioned with respect to one another. Therefore, the novel method can be realized relatively simply and cost-effectively, especially since the lithography process steps are required and proven anyway for the production of circuit structures.

In preferred exemplary embodiments, the semiconductor substrate has a layer thickness of less than 50 µm, preferably a layer thickness of less than 20 µm, i.e. that the semiconductor substrate forms a very thin semiconductor chip having a limited intrinsic flexibility. Such a thin chip can advantageously be laminated into a thin film having a thickness of 0.5 mm and less, as will be explained in greater detail below with reference to a preferred exemplary embodiment.

In any case, the available chip area of the semiconductor substrate can be optimally utilized for producing the circuit structures, since relatively large contact areas on the semiconductor substrate can be dispensed with. It is nevertheless possible, of course, to arrange somewhat enlarged test areas on the semiconductor substrate, for example in each conductor track, in order to enable the integrated circuit structures to be electronically tested before the semiconductor substrate is combined with the flexible film piece. However, these test areas can be smaller than conventional contact pads. In preferred exemplary embodiments, the circuit structures are realized in the semiconductor substrate without specific and— relative to the lateral dimensions of the circuit structures— large contact areas or contact pads, in order to optimally utilize the available chip area. As explained below on the basis of preferred exemplary embodiments, the integrated circuit structures can be tested very well by means of large contact areas on the flexible film piece in a simple and cost-effective manner.

The production of the circuit structures in the semiconductor substrate is preferably effected before the semiconductor substrate is combined with the flexible film piece. In principle, however, the circuit structures could also be wholly or partly produced after the semiconductor substrate has been combined with the film piece. Therefore, the order of the method steps specified above with regard to the production of the circuit structures is not mandatory.

In a preferred refinement of the invention, the semiconductor substrate has a first substrate surface, and the flexible film piece has a first film piece surface, wherein the first substrate surface and the first film piece surface are oriented in plane-parallel fashion.

In this refinement, the first substrate surface and the first film piece surface are situated at the same level and parallel to one another. Consequently, the common continuous contact-connecting layer can be produced more simply. Moreover, the contact-connecting layer can be realized more uniformly and more thinly than in an alternative refinement in which the contact-connecting layer has to compensate for level differences between the semiconductor substrate and the film piece surface.

In a further refinement, the first substrate surface and the first film piece surface together are arranged on a planar holding body in order to orient the first substrate surface and the first film piece surface in plane-parallel fashion.

In this refinement, the combination of semiconductor substrate and first film piece lies on a preferably rigid holding body, while the patterned layer is produced with the electrically conductive contact tracks. In preferred exemplary embodiments, the holding body is a rigid semiconductor substrate, such as a substrate wafer. The refinement allows simple integration into the process sequence which has proved itself in the production of integrated circuits by means of lithography process steps. Moreover, the plane-parallel orientation of substrate surface and film piece surface can be achieved simply and with high accuracy during the subsequent lithography process steps.

In a further refinement, the holding body remains as a transport body on the semiconductor substrate and the flexible film piece.

In this refinement, the holding body is not only used in the production process for orienting and holding the semiconductor substrate and the flexible film piece, but also continues to be used as a holding body after the production process. In particular, the holding body in this refinement serves as a transport medium that enables simple and secure transport of the novel film chip, for instance from the manufacturer to the customer. Furthermore, the holding body can, in principle, also remain permanently on the film chip and serve, for example, as a carrier for further circuit structures.

In a further refinement, the semiconductor substrate has a second substrate surface, which is arranged substantially parallel to the first substrate surface, and the flexible film piece has a second film piece surface, which is arranged substantially parallel to the first film piece surface, wherein the second substrate surface and the second film piece surface are encapsulated with a potting material to form a combined film chip. In one particularly preferred variant of this refinement, the potting material is a polymer material.

In this refinement, the semiconductor substrate and the film piece are not only connected to electrically conductive contact tracks, but they are also joined together mechanically to form a single component. A film chip is thus obtained which has a core composed of the substantially rigid semiconductor material and an at least partly circumferential film edge composed of a flexible foil material.

The refinement has the advantage that the contact tracks produced using the lithography process steps between the semiconductor substrate and the film piece are stabilized and protected against damage owing to a relative movement of semiconductor substrate and film piece. Moreover, the novel film chip can be combined as an integrated component very simply with other components to form a complex circuit, wherein the film chip itself can be contact-connected solely on the flexible edge and in particular away from the semiconductor substrate.

In a further refinement, the semiconductor substrate and the film piece together with the potting material are detached from the common holding body for producing the electrically conductive layer above the first substrate surface and the first film piece surface.

In this refinement, the holding body serves (at least initially) only for orienting the substrate surface and the film piece surface in a manner as plane-parallel as possible. This is very simple by virtue of the semiconductor substrate and the film piece being placed by their respective surfaces on the planar holding body. In some refinements of the invention, the electrically conductive contact tracks are arranged substantially directly on the surfaces oriented with respect to one another. For this purpose, it is necessary to enable direct access to the two surfaces, which is easily achieved by the film chip being detached from the common holding body and, having been turned over, being placed on a second holding body (or on the same holding body again), for instance. This refinement makes it possible, in particular, for the semiconductor substrate and the film piece to be electrically connected to one another without contact holes. Consequently, this refinement enables a very thin, substantially homogeneous and stable layer construction.

In a further refinement, by contrast, contact holes are produced which extend through the potting material to the semiconductor substrate, wherein the contact holes are filled with an electrically conductive material, preferably metal, in order to connect the semiconductor substrate to the electrically conductive layer.

This refinement leads to a more complex layer construction and to a somewhat larger layer thickness of the novel film chip. However, it has the advantage that the film chip can remain on the holding body during the production of the electrically conductive contact tracks. The refinement is therefore simpler with regard to the mechanical handling steps (gripping, positioning, placement, etc.). Error influences and instances of damage which can arise during the mechanical handling of the film chip in the process sequence are reduced.

In a further refinement, there is provided a further flexible film piece having a third lateral dimension which is significantly greater than the second lateral dimension, wherein the film chip is fixed to the further film piece, and wherein the patterned layer is contact-connected to further conductor tracks formed on the further flexible film piece.

In this refinement, the film chip is combined with a further film-like film piece. In preferred exemplary embodiments, the further film piece is a polymer film on which are arranged electronic components which have been or are produced using thick-film process steps. This refinement profits from the fundamental advantages of the novel method to a particular extent since it enables a very simple combination of a relatively small semiconductor chip having a high degree of integration with a large-area organic semiconductor material. With this refinement it is possible to realize, for example, a large-area display with organic light emitting diodes (OLEDs) and an integrated control and driver circuit in a very simple and cost-effective manner It is particularly preferred if the novel film chip is laminated into the large polymer film, as explained further below on the basis of a preferred exemplary embodiment.

In a further refinement, the further conductor tracks are produced using thick-film process steps on the further film piece.

As already indicated above, this refinement enables an optimum combination of the complementary properties of organic and conventional semiconductor circuits. The fundamental differences between the two technologies, which become apparent in particular with regard to the lateral dimensions of the respective structures, can be overcome using the novel method in a very simple and elegant manner by virtue of relatively large contact areas (relative to the lateral dimensions of the circuit structures in the semiconductor substrate) being arranged only in the region of the first film piece and from there all further contact-connections being led to the further film piece.

In a further refinement, the semiconductor substrate in the film chip is completely surrounded by the potting material.

In this refinement, the semiconductor substrate with the integrated circuit structures is protected all around by the potting material. Consequently, this refinement enables robust handling of the novel film chip, whether during integration into a large-area polymer film or else during other applications and processing steps. The risk of damage to the sensitive circuit structures is therefore reduced.

In a further refinement, the patterned layer forms fan-like contact tracks which run radially outward from the semiconductor substrate and expand from the inner portion radially outward. Alternatively or in addition, contact areas specifically designed for the electrical connection of conductor tracks using thick-film technology and/or for the electrical connection of solderable contacts can be arranged in the region of the first film piece.

These refinements enable a very simple and cost-effective connection of "large" conductor track structures to the filigree circuit structures in the semiconductor substrate, without wasting the valuable chip area in the semiconductor substrate. Even if the novel film chip is not combined with a large-area organic electronic unit, this refinement contributes to a cost-effective and diversely usable semiconductor chip. A patterned layer with contact tracks embodied in fan-like fashion has the advantage of smaller contact resistances by comparison with specific delimited contact areas.

In a further refinement, the first flexible film piece is a polymer film.

This refinement enables a cost-effective and diversely usable realization of the novel film chip, and it facilitates the integration of the novel film chip into a large-area film with organic semiconductor elements.

It goes without saying that the features mentioned above and those yet to be explained below can be used not only in the combination respectively indicated, but also in other combinations or by themselves, without departing from the scope of the present invention.

BRIEF DESCRIPTION OF THE DRAWINGS

Exemplary embodiments of the invention are illustrated in the drawing and are explained in greater detail in the following description. In the figures.

DESCRIPTION OF PREFERRED EMBODIMENTS

Figure 1:
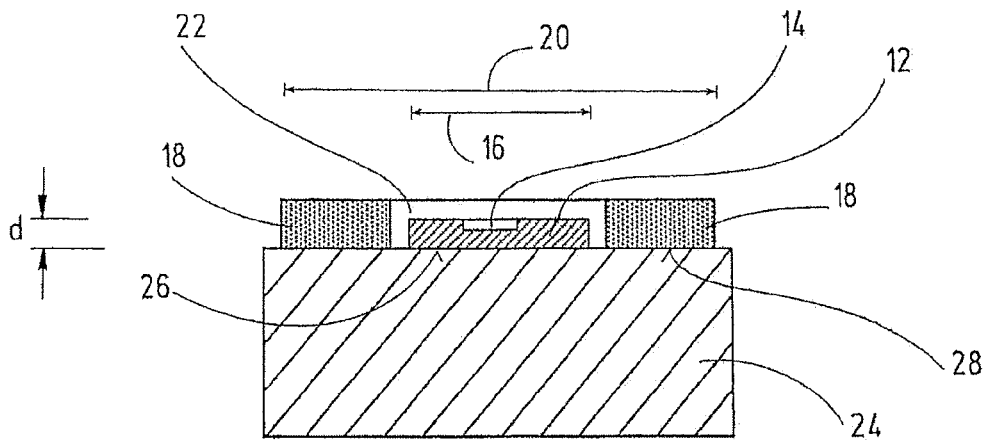
FIGS. 1-3 show intermediate products during the production of an integrated circuit according to one exemplary embodiment of the novel method.
Figure 2:
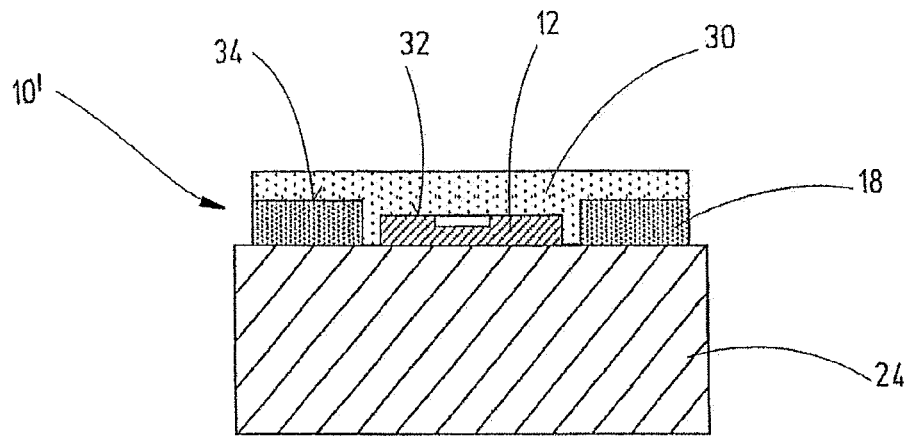
Figure 3:
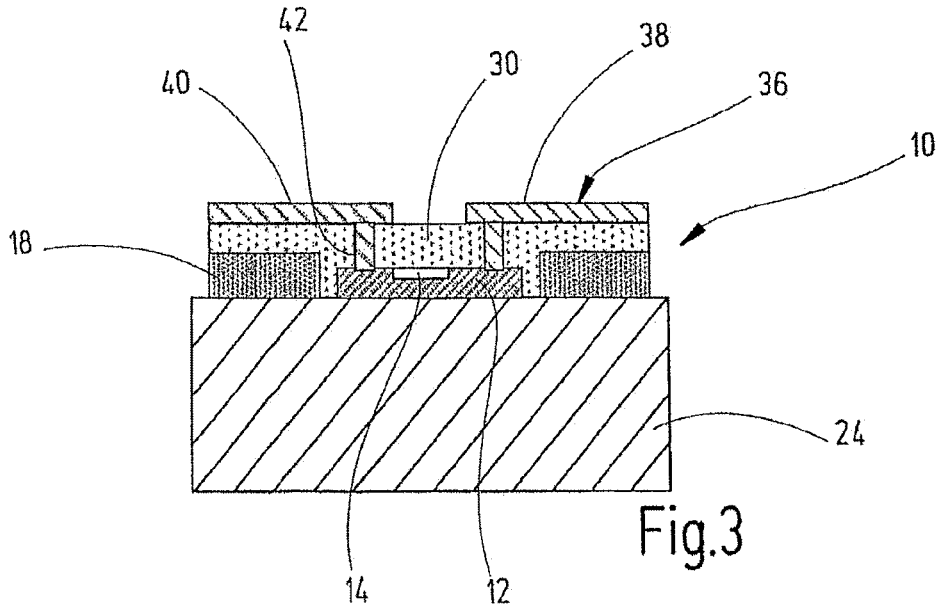

In FIGS. 1 to 3, an exemplary embodiment of the novel film chip is designated in its entirety by reference numeral 10. FIGS. 1 to 3 show individual method steps for producing the film chip 10.

In FIG. 1, a semiconductor substrate is designated by reference numeral 12. The semiconductor substrate already has an integrated circuit structure here, which is indicated schematically at reference numeral 14. The illustration is not to scale. In one exemplary embodiment, the circuit structure 14 is a complex circuit structure that forms a control and driver circuit for a large-area display. However, the circuit structure 14 can also be designed for other tasks.

As is known to experts in this field, the circuit structure 14 can comprise a plurality of transistors which together and/or with further integrated components determine the function of the circuit structure. In this exemplary embodiment, the circuit structure 14 was produced in the semiconductor substrate in previous process steps, which are not illustrated here for the sake of simplicity. Said process steps typically include producing mask structures on the surface of the semiconductor substrate using exposure and etching processes, and introducing and/or depositing impurity materials at the surface of the semiconductor substrate through the mask structures. In general, such a semiconductor substrate with an integrated circuit structure is designated as a semiconductor chip. The semiconductor chip is realized here in an inherently rigid semiconductor material, in particular silicon. Basically, the semiconductor substrate 12 with the integrated circuit structure 14 is a "bare" semiconductor chip which, in conventional methods, would be encapsulated by molding into a rigid chip housing composed of plastic or would be mounted onto a device carrier using flip-chip technology, for example. According to the novel method, the semiconductor chip 12 is combined with a flexible carrier material to form the film chip 10 in the manner described below.

The semiconductor substrate 12 has a first lateral dimension 16, which can be e.g. a square lateral dimension having an edge length of 2 mm. In the preferred exemplary embodiment, the chip thickness d perpendicular to the lateral dimension 16 is less than 50 μm, and in particular in the region of 20 μm. Such thin semiconductor chips are produced in the preferred exemplary embodiments by means of a method described in WO 2007/104443. The disclosure of said document is fully incorporated by reference here.

The semiconductor substrate or the semiconductor chip 12 is combined here with a flexible film piece 18. In preferred exemplary embodiments, the flexible film piece 18 is a polymer film having a lateral dimension 20 that is somewhat greater than the lateral dimension 16 of the semiconductor substrate 12. Preferably, the edge length of the lateral dimension 20 is of an order of magnitude of between 5 mm and 20 mm. In preferred exemplary embodiments, the thickness of the film perpendicular to its lateral dimension is less than 0.5 mm and, in particular, lies in the range of approximately 20 μm to approximately 100 μm. The film 18 has a recess 22, which can be a depression in the manner of a blind hole (not illustrated here) or a through-opening (as illustrated). The internal diameter of the recess 22 is slightly greater than the corresponding external diameter of the semiconductor substrate 12, such that the semiconductor substrate 12 can be arranged in the recess 22.

In FIG. 1, the semiconductor substrate 12 and the film 18 are jointly arranged on a planar holding body 24. The semiconductor substrate has a first substrate surface 26, which bears in plane fashion on the planar top side of the holding body 24. In this case, the film 18 surrounds the semiconductor substrate 12 concentrically and bears with its film piece surface 28 likewise in plane fashion on the holding body 24. Consequently, the substrate surface 26 and the film piece surface 28 are oriented in plane-parallel fashion with respect to one another. In some exemplary embodiments, the holding body 24 serves solely for orienting and holding the semiconductor substrate 12 and the film 18 during the production of the novel film chip, i.e. that the holding body 24 is removed at the end of the production process. In other exemplary embodiments, the holding body 24 can serve as a "transport carrier", on which the film chip is transported from the manufacturer to the customer. Furthermore, it is possible to use the holding body permanently as a carrier body and/or for accommodating further circuit structures.

In accordance with FIG. 2, the semiconductor substrate 12 and the film 18 are then encapsulated with a potting material 30 to form a film chip 10'. In the preferred exemplary embodiments, the potting material 30 also consists of a polymer material. As can readily be discerned with reference to FIG. 2, the potting material 30 is placed here from above onto the semiconductor substrate 12 and the film 18, i.e. that the potting material 30 respectively adheres to that surface which faces away from the holding body 24.

In accordance with FIG. 3, a patterned layer 36 composed of an electrically conductive material is subsequently produced above the semiconductor substrate 12 and the film 18 and on the (cured) potting material 30. In the preferred exemplary embodiments, the electrically conductive material is a metal, for which reason the layer 36 is designated hereinafter as metallization layer. The metallization layer 36 forms electrically conductive contact tracks 38, 40 extending from the semiconductor substrate 12 to the film piece 18.

In one exemplary embodiment, before the metallization layer 36 is produced, through-holes 42 are produced through the potting material 30. At least some of the through-holes 42 are arranged in the region of the semiconductor substrate 12 in order to make contact with the semiconductor substrate 12 and the circuit structure 14 integrated there. The through-holes 42 are filled with the electrically conductive material during the production of the metallization layer, and they thus form a contact track from the metallization layer 36 to the underlying semiconductor substrate 12.

In accordance with one aspect of the invention, the metallization layer 36 is produced here using lithography process steps on the film chip 10'. The process steps include exposure and etching steps and also the deposition or introduction of metal or some other electrically conductive material at exposed surface regions of the film chip 10' that have been uncovered by etching steps. It is possible in principle, but not always necessary, also to arrange contact holes 42 in the region of the film 18 in order to produce an electrical contact track through the potting material 30 to the film 18.

After the production of the patterned metallization layer 36 composing a plurality of separate contact tracks 38, 40, the film chip 10 is available for further processing. In particular, it can be integrated into a large-area polymer film with organic components, as is explained further below with reference to FIG. 6 for a preferred exemplary embodiment. For such further processing, the film chip 10 is detached from the holding body 24 after the patterned metallization layer 36 has been produced. In principle, it is possible for the film chip 10' already to be detached from the holding body 24 before the patterned metallization layer 36 is produced, since the holding body 24 is not absolutely necessary for the production of the metallization layer 36. However, it simplifies the handling of the film chip 10'.

Figure 4:
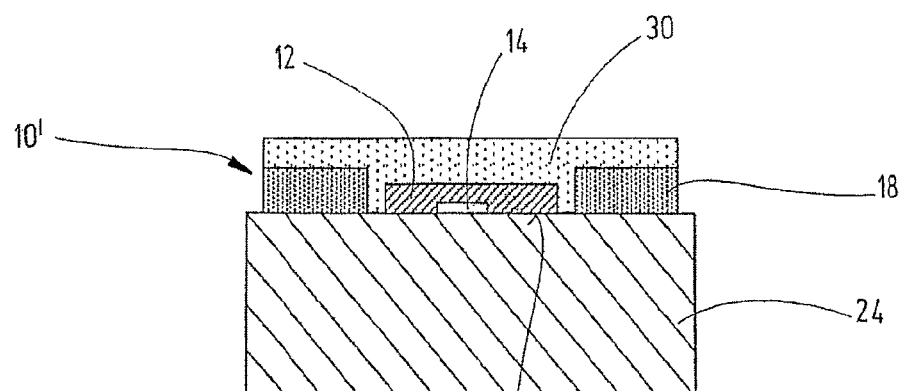
FIGS. 4 and 5 show intermediate products during the production of an integrated circuit in a further exemplary embodiment of the novel method.
Figure 5:
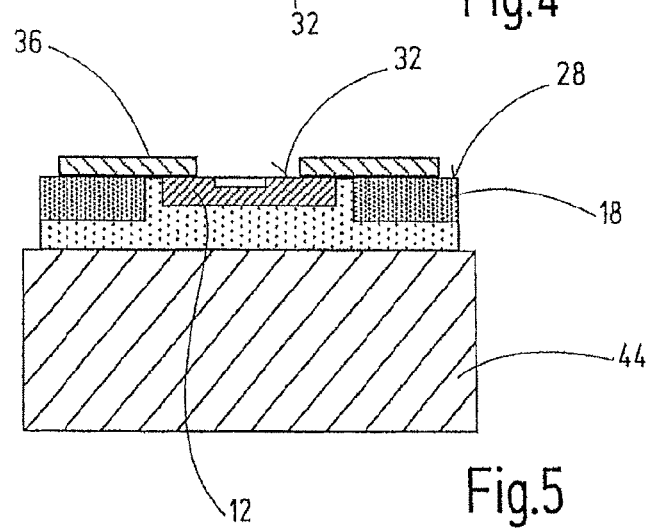

FIGS. 4 and 5 show a further exemplary embodiment of the novel method on the basis of selected intermediate products. The same reference symbols designate the same elements as before.

FIG. 4 shows the semiconductor substrate 12 with an integrated circuit structure 14 and the film 18, which have been combined using the potting material 30 to form the film chip 10'. In contrast to the method in accordance with FIGS. 1 to 3, however, here the semiconductor substrate 12 has been arranged with its upper substrate surface 32 on the holding body 24. This is indicated schematically on the basis of the circuit structure 14 in FIG. 4. In other words, in this exemplary embodiment of the method here, the semiconductor chip 12 is situated in a manner just turned over with respect to the exemplary embodiment in accordance with FIGS. 1 to 3.

In this exemplary embodiment, the film chip 10' is detached from the holding body 24 after encapsulating with the potting material 30, such that the plane-parallel surfaces 32, 28 are directly accessible. In the preferred exemplary embodiment, however, the film chip 10' is once again arranged on a holding body in order to facilitate the subsequent production of the patterned metallization layer 36. In principle, the same holding body 24 can be involved, on which the film chip 10' is merely placed in a manner rotated by 180°, or a second holding body 44 can be involved, using which the film chip 10' is detached from the first holding body 24. Various alternatives for handling the (not yet completed) film chip 10' are feasible here to the relevant experts in this field.

In accordance with FIG. 5, in this exemplary embodiment, the patterned metallization layer 36 is produced directly on the semiconductor substrate 12 and the film 18. However, this does not rule out the fact that intermediate layers can also be present here, which are necessary or unavoidable for process engineering reasons or for other reasons between the metallization layer 36 and the semiconductor substrate 12 and/or between the metallization layer 36 and the film 18. By way of example, a $SiO_2$ layer is often produced for the purpose of passivation and as a protective layer on the surface of a semiconductor substrate with an integrated circuit structure. However, said layer has to be removed at those locations at which the metallization layer 36 makes electrically conductive contact with the integrated circuit structure 14, which in accordance with one aspect of the invention, is effected using lithography process steps. In contrast to the exemplary embodiment from FIGS. 1 to 3, however, here the metallization layer 36 is arranged directly above that substrate surface 32 and that film piece surface 28 which face away from the potting material 30. The exemplary embodiment in accordance with FIGS. 4 and 5 enables a realization without through-holes 42 in the film chip. However, the film chip 10' has to be detached from the holding body 24 before the metallization layer 36 is produced.

In further exemplary embodiments, which are not illustrated separately here, it is conceivable to produce a patterned metallization layer 36 above the semiconductor substrate 12 and the film 18 without previously orienting the semiconductor substrate 12 and the film 18 with plane parallel surfaces. It may also be possible to orient the surfaces 28, 32 of film 18 and semiconductor substrate 32 in plane-parallel fashion in a manner other than has been proposed here using the holding body 24. In such cases, too, it is conceivable to produce the patterned metallization layer 36 directly above the semiconductor substrate 12 and the film 18, without detaching the semifinished film chip 10' from a holding body 24.

Figure 6:
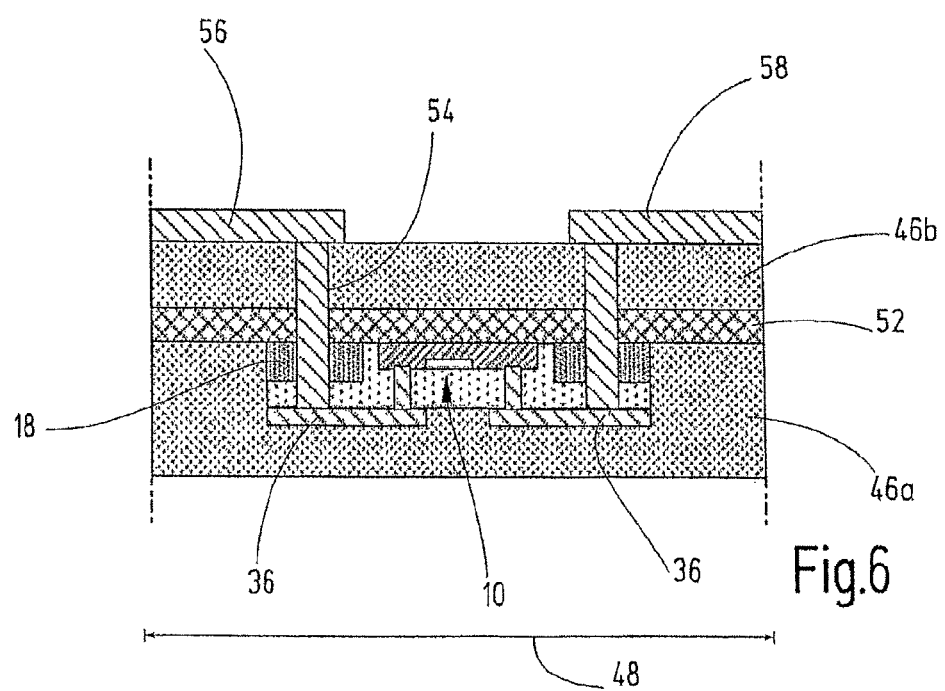
FIG. 6 shows a film chip that has been produced by the method according to the exemplary embodiment in accordance with FIGS. 1-3 and has been integrated into a large-area polymer film.

FIG. 6 shows a particularly preferred exemplary embodiment of the novel method, wherein the film chip 10 is combined with a further flexible film piece, in particular a large-area polymer film. Identical reference numerals designate the same elements as before. It goes without saying that, instead of the film chip 10 produced according to the exemplary embodiment in accordance with FIGS. 1 to 3, the film chip according to the method in accordance with FIGS. 4 and 5 can also be combined with a large-area, further, flexible film piece.

In FIG. 6, the further flexible film piece is a polymer film 46 having a lateral dimension 48 that is significantly greater than the first and second lateral dimensions 16, 20. In some exemplary embodiments, the lateral dimension 48 is of an order of magnitude of 25 cm$^2$ or more, i.e. that the lateral dimension 48 has, for example, an edge length or a diameter of 5 cm or more. In the exemplary embodiment in accordance with FIG. 6, the film chip 10 was arranged with the metallization layer 36 on a film 46a and laminated with a further film 46b and adhesive 52. Here the two films 46a, 46b and the adhesive 52 form the further flexible film piece having the large lateral dimension 48.

After the film chip 10 has been laminated in, through-holes 54 are produced through the film 46 using laser drilling or other suitable methods. The through-holes 54 extend as far as the patterned metallization layer 36. Moreover, further contact tracks 56, 58 composed of an electrically conductive material are produced on the topside and/or underside of the film 46. The contact tracks 56, 58 are electrically conductively connected to the patterned layer 36 through the through-holes 54. This can be effected, for example, by filling the through-holes 54 with an electrically conductive material, in particular metal. In the preferred exemplary embodiments, the contact tracks 56, 58 are produced using thick-film process steps, in particular using printing techniques. The structural dimensions that can thus be achieved are significantly larger than the structural dimensions that can be produced by means of lithography process steps. However, according to the novel method, it suffices to conductively connect the outer contact tracks 56, 58 to the laminated-in contact tracks of the patterned layer 36, wherein the inner contact tracks of the patterned layer 36 advantageously provide for size adaptation.

As can be discerned with reference to FIG. 6, a novel film chip 10 having a semiconductor chip 12 with an integrated circuit structure 14 and a film edge 18 is produced in the preferred exemplary embodiments of the novel method. Such a film chip 10 can be combined with further films and electrically conductively connected in a very simple and cost-effective manner, wherein the first film edge 18 provides relatively large contact areas, without appreciably adversely affecting the chip area within the semiconductor substrate 12.

Figure 7:
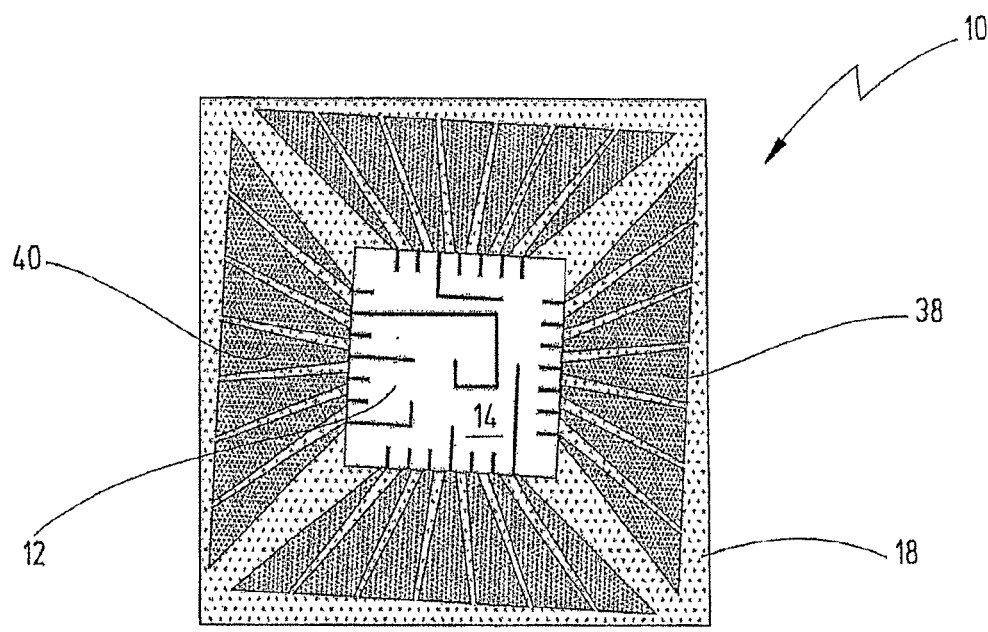
FIG. 7 shows an exemplary embodiment of a film chip that has been produced according to the novel method, in a plan view.

FIG. 7 shows a schematic illustration of an exemplary embodiment of the novel film chip 10 in a plan view. Identical reference numerals designate the same elements as before.

As can be discerned with reference to FIG. 7, the novel method is relatively robust with respect to tolerances during the positioning of the semiconductor substrate 12 relative to the first film piece 18, since the contact tracks 38, 40 are produced only after the positioning of semiconductor substrate 12 and film piece 18 using the lithography process steps. Possible position tolerances can therefore be taken into account during the production of the patterned layer 36 with the contact tracks 38, 40. As can additionally be discerned with reference to FIG. 7, in this exemplary embodiment the film chip 10 has contact tracks 38, 40 which are embodied in fan-like fashion and which expand from the inner portion radially outward. In this way, this exemplary embodiment enables low-resistance contact to be made with the filigree circuit structure 14 at relatively wide contact areas.

Figure 8:
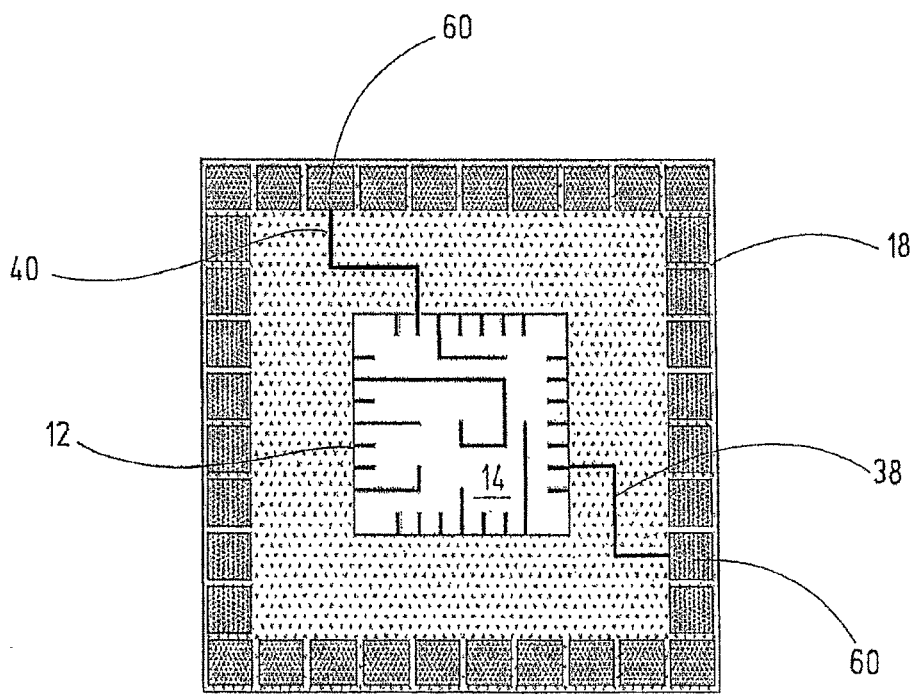
FIG. 8 shows a further exemplary embodiment of the novel film chip.

FIG. 8 shows a further exemplary embodiment of a film chip produced according to the novel method. In this exemplary embodiment, the film chip has, in the region of the flexible film 18, contact areas 60 embodied here in rectangular, and in particular square, fashion. The individual contact areas 60 on the film edge 18 are connected to the circuit structure 14 in the semiconductor substrate 12 by means of filigree contact tracks 38, 40. This exemplary embodiment yields "conventional bonding pads" 60, which, however, are now arranged on the flexible film edge 18 of the novel film chip. Here, too, the relatively large contact areas do not reduce the useable chip area in the semiconductor substrate 12. It is conceivable to arrange contact areas 60 not only at the outer edge of the flexible film 18 but in the entire area region around the semiconductor substrate 12, wherein the corresponding contact tracks 38, 40 then have to be led through between the individual contact areas 60. Such an exemplary embodiment makes it possible to provide very many large contact areas, which is advantageous primarily for producing graphical displays.

In all the exemplary embodiments of the invention, the semiconductor substrate 12 has no or only a very small number of conventional, relatively large contact areas. A small number of conventional, larger contact areas can be arranged on the semiconductor substrate for test purposes. Furthermore, this semiconductor substrate is combined with a flexible film piece, in particular a film edge, on which relatively large contact areas are formed. An electrically conductive, patterned layer that provides contact tracks from the semiconductor substrate to the large contact areas was produced using lithography process steps on the novel film chip in order to electrically conductively connect the semiconductor substrate and the circuit structures integrated there to the contact areas on the film piece. Consequently, virtually the entire area of the semiconductor substrate is available for the integrated circuit structures. Moreover, the novel film chip can be connected to organic semiconductor components very simply and cost-effectively by virtue of comparatively coarse contact tracks being produced by means of thick-film process steps. The interface between the semiconductor substrate and the film edge is advantageously produced exclusively by means of lithography process steps. In some preferred exemplary embodiments, the semiconductor substrate is completely surrounded by a polymer layer that protects the integrated circuit structures against external ambient influences and enables, for example, the mounting of the new film chip "from the roll".

What is claimed is:

1. A method for producing an integrated circuit, comprising the steps of:
    providing a semiconductor substrate having a first lateral dimension and having a first substrate surface and a second substrate surface arranged substantially parallel to the first substrate surface,
    producing circuit structures in the semiconductor substrate using lithography process steps,
    providing a first flexible film piece having a second lateral dimension which is greater than the first lateral dimension, and having a recess in the lateral dimension, said first flexible film piece further having a first film piece surface and a second film piece surface which is arranged substantially parallel to the first film piece surface, arranging the semiconductor substrate and the first flexible film piece on a holding body, with said semiconductor substrate being positioned in the recess, encapsulating the second substrate surface and the second film piece surface with a potting material in order to form a combined film, chip, detaching the film chip from the holding body, and producing a patterned layer of an electrically conductive material above the semiconductor substrate and the first flexible film piece using lithography process steps, wherein the patterned layer extends from the semiconductor substrate to the first flexible film piece and forms a number of electrically conductive contact tracks between the semiconductor substrate and the first film piece, wherein the first substrate surface and the first film piece surface are arranged on the holding body in a plane-parallel fashion in order to orient the first substrate surface and the first film piece surface in plane-parallel fashion, wherein the combined film chip is detached from the holding body such that the plane-parallel first substrate surface and first film piece surface are directly accessible, and wherein the patterned layer is produced directly on the semiconductor substrate and the first flexible film piece such that the semiconductor substrate and the film piece are electrically connected without contact holes.

2. The method of claim 1, wherein the potting material is a polymer material.

3. The method of claim 1, wherein a further flexible film piece is provided, said further flexible film piece having a third lateral dimension which is significantly greater than the second lateral dimension, wherein the film chip is fixed to the further film piece, and wherein the patterned layer is contact-connected to further conductor tracks formed on the further flexible film piece.

4. The method of claim 3, wherein the further conductor tracks are produced using thick-film process steps on the further film piece.

5. The method of claim 1, wherein the patterned layer forms fan-like contact tracks which run radially outward from the semiconductor substrate and expand from the inner portion radially outward.

6. The method of claim 1, wherein the first flexible film piece is a polymer film.

7. A film chip comprising an integrated electronic circuit, comprising a semiconductor substrate having a first lateral dimension, in which circuit structures have been produced using lithography process steps, comprising a flexible film piece having a second lateral dimension which is greater than the first lateral dimension, and having a recess in the second lateral dimension, wherein the semiconductor substrate is arranged in the recess, and comprising a patterned layer composed of an electrically conductive material above the semiconductor substrate and the film piece, said patterned layer extending from the semiconductor substrate to the film piece and forming a number of electrically conductive contact tracks between the semiconductor substrate and the film piece, wherein the patterned layer is produced using lithography process steps, and wherein the patterned layer is produced directly on the semiconductor substrate and the first flexible film piece such that the semiconductor substrate and the film piece are electrically connected without contact holes.

* * * * *